(12) United States Patent
Sun et al.

(10) Patent No.: US 10,797,104 B2
(45) Date of Patent: Oct. 6, 2020

(54) DISPLAY SUBSTRATE, DISPLAY PANEL, AND DISPLAY DEVICE HAVING ELECTROSTRICTION LAYER

(71) Applicants: BEIJING BOE DISPLAY TECHNOLOGY CO., LTD., Beijing (CN); BOE TECHNOLOGY GROUP CO., LTD., Beijing (CN)

(72) Inventors: Shumeng Sun, Beijing (CN); Minghui Zhang, Beijing (CN); Inho Park, Beijing (CN); Weitao Chen, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/472,341

(22) PCT Filed: Oct. 16, 2018

(86) PCT No.: PCT/CN2018/110491
§ 371 (c)(1),
(2) Date: Jun. 21, 2019

(87) PCT Pub. No.: WO2019/085744
PCT Pub. Date: May 9, 2019

(65) Prior Publication Data
US 2019/0378875 A1  Dec. 12, 2019

(30) Foreign Application Priority Data
Nov. 1, 2017  (CN) .......................... 2017 1 1058089

(51) Int. Cl.
*H01L 27/20* (2006.01)
*H01L 41/09* (2006.01)
*H01L 41/187* (2006.01)

(52) U.S. Cl.
CPC .......... *H01L 27/20* (2013.01); *H01L 41/0926* (2013.01); *H01L 41/1876* (2013.01)

(58) Field of Classification Search
CPC ...................................................... H01L 27/20
See application file for complete search history.

(56) References Cited

U.S. PATENT DOCUMENTS

| 9,857,645 B2 | 1/2018 | Sugita et al. |
| 2002/0191947 A1* | 12/2002 | Takeuchi ............... G02B 26/02 385/147 |

(Continued)

FOREIGN PATENT DOCUMENTS

| CN | 104620154 A | 5/2015 |
| CN | 107240600 A | 10/2017 |
| CN | 207409493 U | 5/2018 |

OTHER PUBLICATIONS

International Search Report and Written Opinion in corresponding International Patent Application No. PCT/CN2018/110491 dated Jan. 18, 2019 (an English translation attached hereto). 17 pages.

*Primary Examiner* — Matthew E Warren
(74) *Attorney, Agent, or Firm* — Leason Ellis LLP

(57) ABSTRACT

A display substrate, a display panel, and a display device. The display substrate includes multiple pixel units arranged in an array manner. At least one of pixel unit includes a first electrode. Each first electrode includes a first electrode body, a first electrostriction layer connected to the first electrode body, and a first drive electrode electrically connected to the first electrostriction layer. The first electrostriction layer is configured to be expanded and shrunk with an electrical (Continued)

signal of the first drive electrode and to drive the first electrode body to be expanded and shrunk.

17 Claims, 4 Drawing Sheets

(56) References Cited

U.S. PATENT DOCUMENTS

| | | |
|---|---|---|
| 2010/0270917 A1 | 10/2010 | Chuang et al. |
| 2012/0133622 A1* | 5/2012 | Brokken ............... G06F 3/016 345/204 |
| 2014/0098075 A1* | 4/2014 | Kwak ................. G06F 3/0487 345/204 |
| 2017/0123281 A1* | 5/2017 | Lee .................. G02F 1/134309 |

* cited by examiner

DISPLAY SUBSTRATE, DISPLAY PANEL, AND DISPLAY DEVICE HAVING ELECTROSTRICTION LAYER

CROSS-REFERENCE TO RELATED PATENT APPLICATIONS

The present application is a U.S. National Stage Application under 35 U.S.C. § 371 of International Patent Application No. PCT/CN2018/110491, filed Oct. 16, 2018, which claims priority to Chinese Patent Application No. 201711058089.7, filed on Nov. 1, 2017, both of which are incorporated by reference in their entireties as part of the present application.

TECHNICAL FIELD

Embodiments of the present disclosure relate to a display substrate, a display panel and a display device.

BACKGROUND

With the continuous development of display technologies, curved surface display technology, flexible display technology and the like become a research hotspot. Curved surface display technology refers to the display technology where the display panel has a radian, which can improve the user's visual experience. Since an edge that is bent toward the user of the display panel having a radian can be closer to the user, the viewing angle is basically the same as the center of the screen. The display panel provides a wider view field and allows the user to experience a better viewing effect. Flexible display technology refers to the display technology where the display panel is made of a flexible material and is deformable and bendable.

SUMMARY

At least one embodiment of the present disclosure provides a display substrate, the display substrate includes: a plurality of pixel units arranged in an array, each of the pixel units includes: a first electrode, the first electrode includes a first electrode body, a first electrostriction layer connected to the first electrode body and a first driving electrode electrically connected to the first electrostriction layer. The first electrostriction layer is configured to expand or shrink according to an electric signal of the first driving electrode and drive the first electrode body to expand or shrink.

For example, in some examples, the first driving electrode includes at least one first sub driving electrode pair, two first sub driving electrodes of each first sub driving electrode pair are respectively on two opposite ends of the first electrostriction layer in a first direction, and the first electrostriction layer is configured to expand or shrink in the first direction according to the electric signal of the first driving electrode.

For example, in some examples, the first electrostriction layer includes: a plurality of first sub electrostriction strips, spaced apart from one another on a surface at a side of the first electrode body.

For example, in some examples, the first electrode body includes a plurality of first sub electrode strips, the first electrostriction layer includes a plurality of first sub electrostriction strips, and the plurality of first sub electrode strips and the plurality of first sub electrostriction strips are disposed alternately and on a same layer.

For example, in some examples, the first electrode body includes a flexible electrode material.

For example, in some examples, the first electrode body includes a transparent electrode material, and the first electrostriction layer includes a transparent electrostriction material.

For example, in some examples, the transparent electrostriction material includes a lead lanthanum zirconate titanate material.

For example, in some examples, the first driving electrode and the first electrode body are insulated from each other, and the first electrostriction layer and the first electrode body are insulated from each other.

For example, in some examples, each of the pixel units further includes: a second electrode; and a light-emitting layer between the first electrode and the second electrode, the second electrode includes a second electrode body, a second electrostriction layer connected to the second electrode body and a second driving electrode electrically connected to the second electrostriction layer. The second electrostriction layer is configured to expand or shrink according to an electric signal of the second driving electrode and drive the second electrode body to expand or shrink.

For example, in some examples, the second driving electrode includes at least one second sub driving electrode pair, two second sub driving electrodes of each second sub driving electrode pair are respectively on two opposite ends of the second electrostriction layer in a second direction, and the second electrostriction layer is configured to expand or shrink in the second direction according to the electric signal of the second driving electrode.

For example, in some examples, the first direction and the second direction are identical to each other.

For example, in some examples, the second electrode body includes a plurality of second sub electrode strips, the second electrostriction layer includes a plurality of second sub electrostriction strips, and the plurality of second sub electrode strips and the plurality of second sub electrostriction strips are disposed alternately and on a same layer.

For example, in some examples, each of the pixel units further includes: a hole injection layer on a side of the first electrode close to the light-emitting layer; a hole transport layer on a side of the hole injection layer close to the light-emitting layer; an electron injection layer on a side of the second electrode close to the light-emitting layer; and an electron transport layer on a side of the electron injection layer close to the light-emitting layer.

For example, in some examples, the second electrode body includes a flexible electrode material.

For example, in some examples, the second electrode body includes a transparent electrode material, and the second electrostriction layer includes a transparent electrostriction material.

At least one embodiment of the present disclosure further provides a display panel, the display panel includes the display substrate according to any example of the above, and the display panel further includes: a first base substrate; a second base substrate, disposed opposite to the first base substrate; and a supporting structure between the first base substrate and the second base substrate, the plurality of pixel units are disposed between the first base substrate and the second base substrate, the supporting structure is disposed around the pixel units, the supporting structure is connected to the light-emitting layer of each of the pixel units to support each of the pixel units, and the pixel units are respectively spaced apart from the first base substrate and the second base substrate.

For example, in some examples, the supporting structure includes a pixel defining structure.

At least one embodiment of the present disclosure further provides a display device, the display device includes the display panel according to any example of the above.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

Figure 1:
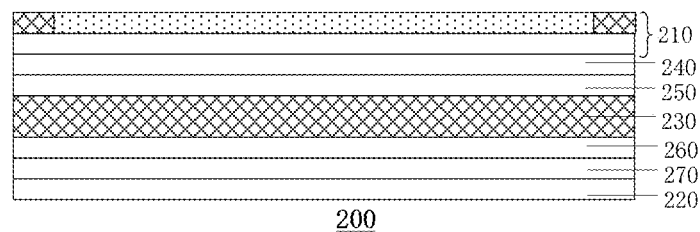
FIG. 1 is a schematic structural diagram of a display substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In the study, the inventors of the present application notice that the curvature of a common curved surface display panel is fixed, that is to say, the optimal viewing position of the curved surface display panel is relatively fixed, and the viewing experience will be greatly reduced when the user is in other viewing positions. On the other hand, flexible display panel can be bent, stretched or even folded under the action of external force, however, bending curvature of a flexible display panel is usually uncontrollable, resulting in a poor viewing experience. Therefore, the inventors of the present application have thought of combining the curved surface display technology with the flexible display technology to adjust the bending curvature of a display panel so that the optimal bending curvature can be adjusted according to the position of the user to achieve an optimal viewing experience.

Embodiments of the present disclosure provide a display substrate, a display panel and a display device. The display substrate includes: a plurality of pixel units arranged in an array, each of the pixel units includes: a first electrode, including a first electrode body, a first electrostriction layer connected to the first electrode body and a first driving electrode electrically connected to the first electrostriction layer. The first electrostriction layer is configured to expand or shrink according to an electric signal of the first driving electrode and drive the first electrode body to expand or shrink. Therefore, the display substrate can expand or shrink the first electrode body at least by controlling the first driving electrode pair to apply an electric signal to the first electrostriction layer, so that the curvature of the display substrate can be changed in whole or in part to realize the curved surface display, and the bending curvature of the display substrate can be controlled.

Hereinafter, the display substrate, display panel and display device provided by embodiments of the present disclosure are described in detail with reference to the accompanying drawings.

Figure 2:
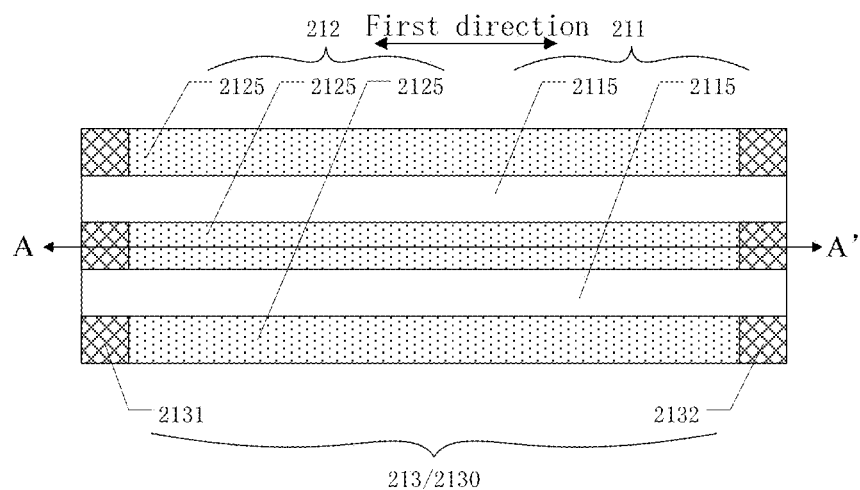
FIG. 2 is a schematic plan view of a first electrode according to an embodiment of the present disclosure.

FIG. 1 is a schematic structural diagram of a display substrate according to an embodiment of the present disclosure. The display substrate includes a plurality of pixel units arranged in an array. In order to describe the display substrate more clearly and more briefly, FIG. 1 merely illustrates one pixel unit 200, as illustrated in FIG. 1, and the pixel unit 200 includes a first electrode 210. FIG. 2 illustrates a schematic plan view of the first electrode according to an embodiment of the present disclosure. As illustrated in FIG. 2, the first electrode 210 includes a first electrode body 211, a first electrostriction layer 212 connected to the first electrode body 211 and a first driving electrode 213 connected to the first electrostriction layer 212; the first electrostriction layer 212 can expand or shrink according to an electric signal of the first driving electrode 213 and drive the first electrode body 211 to expand or shrink. It should be noted that, as described in the above embodiment, the first electrode body 211 and the first electrostriction layer 212 can be disposed on a same layer or on different layers. In addition, when the first driving electrode is not applied with an electric signal, the display substrate can be a flat surface display substrate so that the flat surface displaying can be performed.

In the display substrate provided by the embodiment, the first electrode body can be expanded or shrunk by controlling the first driving electrode to apply an electric signal to the first electrostriction layer. The extension or shrink of the first electrode body can drive each pixel unit to bend, and then the curvature of the display substrate is changed in whole or in part to realize the curved surface display. Since the degree of the extension or shrink of the first electrode body can be controlled by the voltage or current of the first driving electrode, the bending curvature of the display substrate can also be controlled by the voltage or current of the first driving electrode. Therefore, the bending curvature of the display substrate can be adjusted according to the viewing position of the user and other needs, and the display effect is optimized. In addition, in the display substrate, since each first electrode can be individually controlled to bend, a local curvature of the display substrate can be adjusted more meticulously to realize various display effects, such as a wave effect. Moreover, the display substrate does not need to additionally increase a bending curvature adjustment structure, and has the advantages such as being light and thin, having low process difficulty, etc.

For example, in some examples, as illustrated in FIG. 2, the first driving electrode 213 includes at least one first sub driving electrode pair 2130, which includes two first sub driving electrodes 2131 and 2132, two first sub driving electrodes 2131 and 2132 of each first sub driving electrode pair 2130 can be respectively disposed on two opposite ends of the first electrostriction layer 212 in a first direction. The first electrostriction layer 212 can expand or shrink in the first direction under the electric signal of the first driving electrode 213.

Figure 3A:
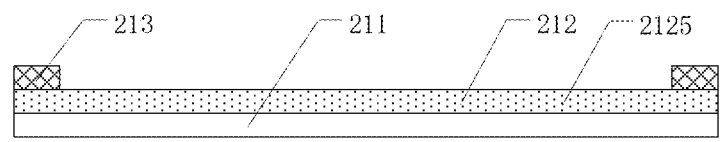
FIG. 3A is a schematic section view of a first electrode taken along line A-A' of FIG. 2 according to an embodiment of the present disclosure.

For example, in some examples, as illustrated in FIG. 2, the first electrostriction layer 212 includes a plurality of first sub electrostriction strips 2125; the plurality of first sub electrostriction strips 2125 are spaced apart from one another on a surface at a side of the first electrode body 211. FIG. 3A illustrates a schematic sectional view of a first electrode taken along line A-A' of FIG. 2 according to an embodiment of the present disclosure. As illustrated in FIG. 3A, the plurality of first sub electrostriction strips 2125 are spaced apart from one another on a surface at a side of the first electrode body 211.

For example, in some examples, as illustrated in FIG. 2, the first sub electrostriction strips 2125 extend in the first direction, the plurality of the first sub electrostriction strips 2125 are spaced apart from one another in a direction perpendicular to the first direction.

Figure 3B:
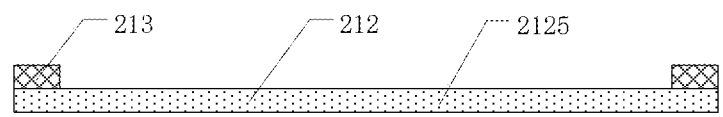
FIG. 3B is a schematic section view of another first electrode taken along line A-A' of FIG. 2 according to an embodiment of the present disclosure.

For example, in some examples, as illustrated in FIG. 2, the first electrode body 211 includes a plurality of first sub electrode strips 2115, and the first electrostriction layer 212 includes a plurality of first sub electrostriction strips 2125. FIG. 3B illustrates a schematic sectional view of another first electrode taken along line A-A' of FIG. 2 according to an embodiment of the present disclosure. As illustrated in FIGS. 2 and 3B, the plurality of first sub electrode strips 2115 and the plurality of first sub electrostriction strips 2125 are disposed alternately and on the same layer. Thereby, the additionally provided first electrostriction layer does not increase the thickness of the first electrode, which facilitates the thinning of the display substrate.

Figure 3C:
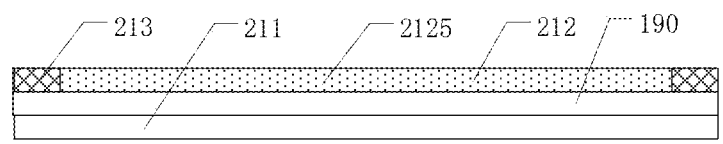
FIG. 3C is a schematic section view of another first electrode taken along line A-A' of FIG. 2 according to an embodiment of the present disclosure.

For example, in some examples, the first driving electrode is insulated from the first electrode body, the first electrostriction layer is insulated from the first electrode body. For example, FIG. 3C illustrates a schematic sectional view of another first electrode taken along line A-A' of FIG. 2 according to an embodiment of the present disclosure. As illustrated in FIG. 3C, the first electrode body 211 can be insulated from the first electrostriction layer 212 by disposing an insulating layer 190 between the first electrode body 211 and the first electrostriction layer 212. At the same time, the insulating layer 190 disposed between the first electrode body 211 and the first electrostriction layer 212 can also insulate the first electrode body 211 from the first driving electrode 213. It should be noted that, the embodiment of the present disclosure includes but is not limited to this, other methods can also be adopted to achieve the insulation between the first driving electrode and the electrode body, and the insulation between the first electrostriction layer and the first electrode body. In addition, since the first driving electrode is insulated from the first electrode body, the mutual interference between the electric signal of the first driving electrode and the electric signal of the first electrode body is prevented.

For example, in some examples, as illustrated in FIG. 3C, the first driving electrode 213 can be disposed on two ends of the first electrostriction layer 212, that is, the first driving electrode 213 and the first electrostriction layer 212 can be disposed on the same layer. Thereby, the additionally provided first driving electrode does not increase the thickness of the first electrode, which facilitates the thinning of the display substrate.

For example, in some examples, the first electrode body includes a flexible electrode material. That is to say, the first electrode body is a flexible electrode, thereby it can be easily expanded or shrunk when the first electrostriction layer is expanded or shrunk.

For example, the first electrode body can include a carbon-based flexible material, such as graphene. Of course, the embodiment of the present disclosure includes but is not limited to this, the first electrode body can also be other flexible materials.

For example, in some examples, the first electrode body includes a transparent electrode material, the first electrostriction layer includes a transparent electrostriction material, that is to say, the first electrode body and the first electrostriction layer can be transparent, thereby avoiding affecting the aperture ratio or light transmission ratio of the display substrate.

For example, the first electrode body can be an indium tin oxide (ITO) material.

For example, in some examples, the transparent electrostriction material includes a lead lanthanum zirconate titanate (PLZT) material.

Figure 4:
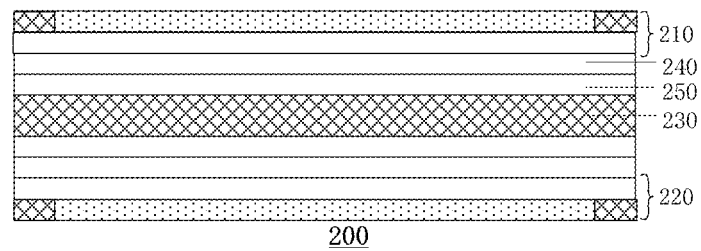
FIG. 4 is a schematic structural diagram of another display substrate according to an embodiment of the present disclosure.

FIG. 4 illustrates a schematic diagram illustrating a structure of another display substrate according to an embodiment of the present disclosure. As illustrated in FIG. 4, each pixel unit 200 further includes a second electrode 220 and a light-emitting layer 230 between the first electrode 210 and the second electrode 220. In the display substrate, the second electrode 220 can adopt a structure similar to that of the first electrode 210. For details, refer to the related description of the first electrode.

For example, in some examples, as illustrated in FIG. 4, each pixel unit 200 further includes: a hole injection layer 240 on a side of the first electrode 210 close to the light-emitting layer 230; a hole transport layer 250 on a side of the hole injection layer 240 close to the light-emitting layer 230; an electron injection layer 270 on a side of the second electrode 220 close to the light-emitting layer 230; and an electron transport layer 260 on a side of the electron injection layer 270 close to the light-emitting layer 230.

Figure 5:
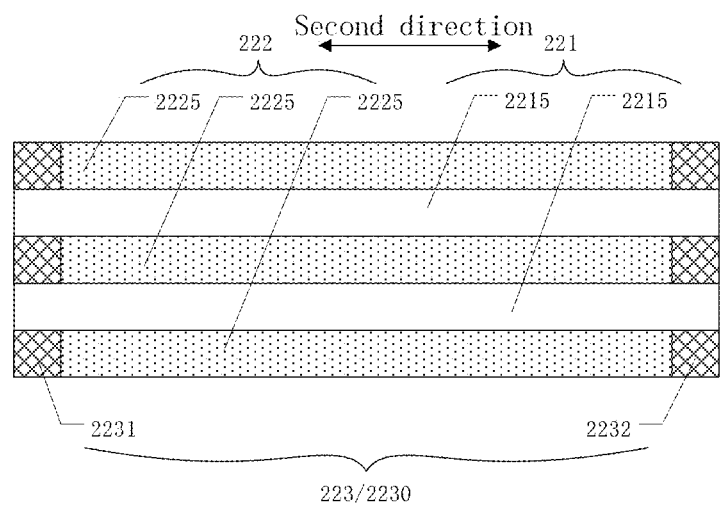
FIG. 5 is a schematic plan view of a second electrode according to an embodiment of the present disclosure.

FIG. 5 illustrates a schematic plan view of a second electrode according to an embodiment of the present disclosure. As illustrated in FIG. 5, the second electrode 220 includes a second electrode body 221, a second electrostriction layer 222 connected to the second electrode body 221 and a second driving electrode 223 connected to the second electrostriction layer 222; the second electrostriction layer 222 can be expanded or shrunk according to an electric signal of the second driving electrode 223 and drive the second electrode body 221 to expand or shrink. Therefore, the display substrate can expand or shrink the first electrode body and the second electrode body by controlling the first driving electrode and the second driving electrode to respectively apply electric signals to the first electrostriction layer and the second electrostriction layer. Thereby the expansion or shrink of the first electrode body and the second electrode body can drive the display substrate to bend and control the bending curvature to perform the curved surface display, and the bending curvature of the display substrate can be adjusted according to the viewing position of the user and other needs, and the display effect is optimized. It should be noted that, as described in the above embodiments, the second electrode body 221 and the second electrostriction layer 222 can be disposed on the same layer or on different layers. In addition, when the first driving electrode and the second driving electrode does not be applied with electric signals, the display substrate can be a flat display substrate so that flat displaying can be performed.

For example, in some examples, as illustrated in FIG. 5, the second electrostriction layer 222 can expand or shrink in a second direction under the electric signal of the second driving electrode 223, the second driving electrode 223 includes at least one second sub driving electrode pair 2230, which includes second sub driving electrodes 2231 and 2232, which are respectively disposed on two opposite ends of the second electrostriction layer 222 in the second direction.

For example, in some examples, the first direction and the second direction can be the same direction.

For example, in some examples, as illustrated in FIG. 5, the second electrode body 221 includes a plurality of second sub electrode strips 2215, the second electrostriction layer 222 includes a plurality of second sub electrostriction strips 2225, the plurality of second sub electrode strips 2215 and the plurality of second sub electrostriction strips 2225 are disposed alternately. Of course, the present disclosure includes but is not limited to this, the second electrode body and the second electrostriction layer can be disposed on different layers. For details, refer to the related description of the first electrode.

For example, in some examples, the adjacent side surfaces of the alternately disposed first sub electrode strips and first sub electrostriction strips are connected, so that the first electrode body and the first electrostriction layer are connected, and when the first electrostriction layer is expanded or shrunk, it is convenient to drive the first electrode body to be expanded or shrunk. In the same way, the adjacent side surfaces of the alternately disposed second sub electrode strips and second sub electrostriction strips are connected, so that the second electrode body and the second electrostriction layer are connected, and when the second electrostriction layer is expanded or shrunk, it is convenient to drive the second electrode body to be expanded or shrunk.

Figure 6:
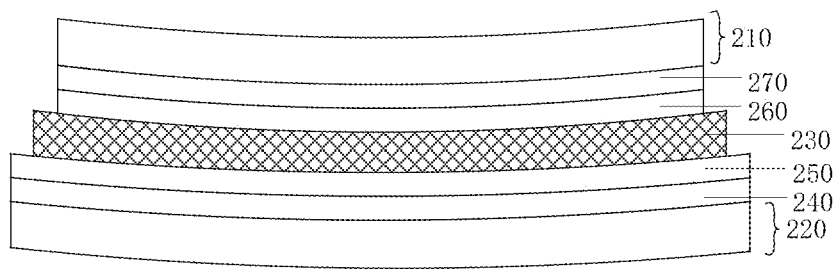
FIG. 6 is a schematic diagram of a bending operation of a pixel unit according to an embodiment of the present disclosure.
Figure 7:
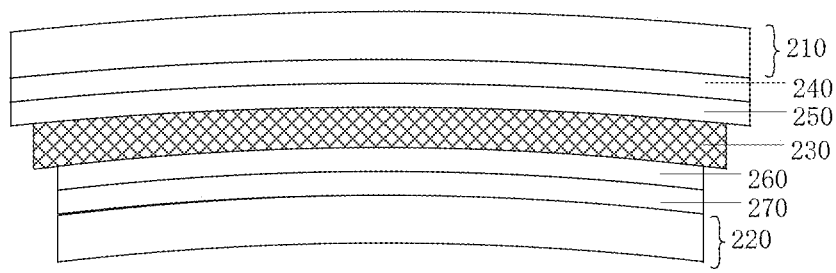
FIG. 7 is a schematic diagram of another bending operation of a pixel unit according to an embodiment of the present disclosure.

FIGS. 6 and 7 illustrate schematic diagrams of a bending operation of a pixel unit according to an embodiment of the present disclosure. As illustrated in FIG. 6, when the first electrode 210 is shrunk by controlling the first driving electrode and the second electrode 220 is expanded by controlling the second driving electrode, the pixel unit can be driven to bend to the side where the first electrode 210 is located. As illustrated in FIG. 7, when the first electrode 210 is expanded by controlling the first driving electrode and the second electrode 220 is shrunk by controlling the second driving electrode, the pixel unit can be driven to bend to the side where the second electrode 220 is located.

Figure 8:
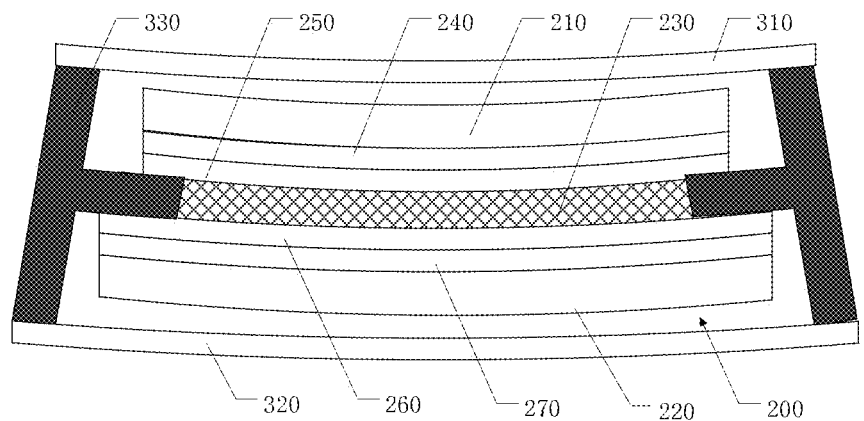
FIG. 8 is a schematic structural diagram of a display panel according to an embodiment of the present disclosure.

FIG. 8 is a schematic diagram illustrating a structure of a display panel according to an embodiment of the present disclosure. The display panel includes the display substrate according to any one of the above embodiments. As illustrated in FIG. 8, the display panel further includes a first base substrate 310, a second base substrate 320 disposed opposite to the first base substrate 310, and a supporting structure 330 which is disposed between the first base substrate 310 and the second base substrate 320 and around each pixel unit 200. The pixel units 200 are disposed between the first base substrate 310 and the second base substrate 320, the light-emitting layer 230 of each pixel unit 200 is connected to the supporting structure 330. The pixel units 200 are respectively spaced apart from the first base substrate 310 and the second base substrate 320. Therefore, the pixel units 200 are not connected to the first base substrate 310 and the second base substrate 320, and it is convenient to drive the pixel units to bend by the extension or shrink of the first electrode and the second electrode. Of course, the present disclosure includes but is not limited to this, the pixel units can also be connected to the first base substrate and the second substrate.

Figure 9:
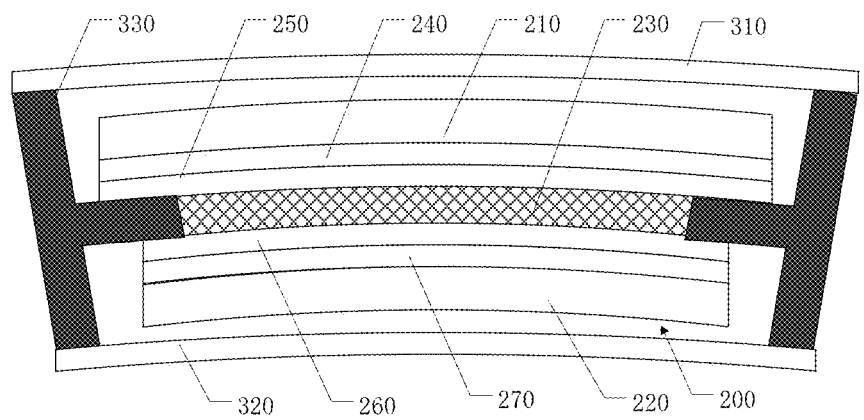
FIG. 9 is a schematic diagram of a bending operation of a display panel according to an embodiment of the present disclosure.

FIGS. 8 and 9 illustrate schematic diagrams of a bending operation of another display panel according to an embodiment of the present disclosure. In the display panel, as illustrated in FIG. 8, when the first electrode 210 is shrunk by controlling the first driving electrode and the second electrode 220 is expanded by controlling the second driving electrode, the display substrate can be driven to bend to the side where the first electrode 210 is located. As illustrated in FIG. 9, when the first electrode 210 is expanded by controlling the first driving electrode and the second electrode 220 is shrunk by controlling the second driving electrode, the display substrate can be driven to bend to the side where the second electrode 220 is located.

For example, in some examples, the supporting structure 330 can be a pixel defining structure to define each pixel unit or sub pixel unit of the display substrate.

For example, in some examples, the first base substrate includes flexible substrate material(s), the second base substrate includes flexible substrate material(s).

For example, the flexible substrate material(s) include plastics, ultra-thin glass, paper materials and biocomposite films.

For example, in some examples, the supporting structure includes a flexible supporting structure.

Figure 10:
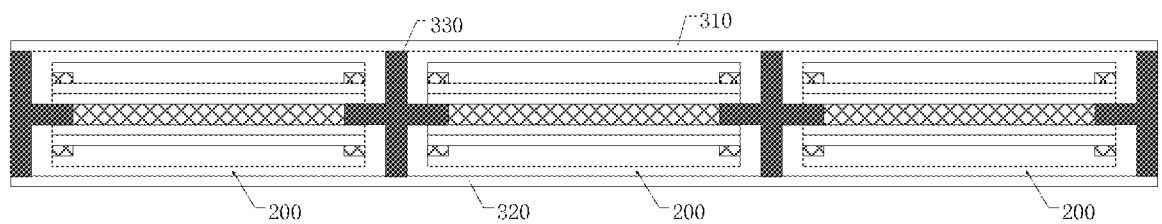
FIG. 10 is another schematic structural diagram of a display panel according to an embodiment of the present disclosure.

FIG. 10 is another schematic diagram illustrating a structure of a display panel according to an embodiment of the present disclosure. FIG. 10 illustrates three pixel units 200. The specific structure of each pixel unit 200 refers to the above description, which is not described herein again. The display substrate can be changed in whole or in part to achieve the curved surface display by respectively controlling the bending degree, i.e. the bending curvature of each pixel unit 200.

Figure 11:
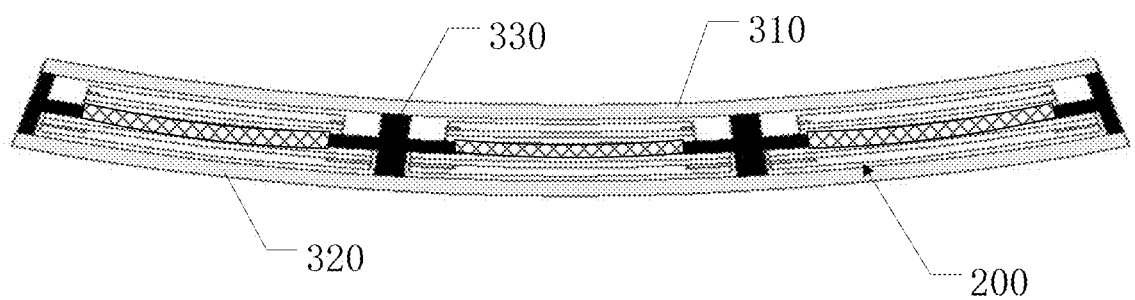
FIG. 11 is a schematic diagram illustrating a bend state of a display panel according to an embodiment of the present disclosure.
Figure 12:
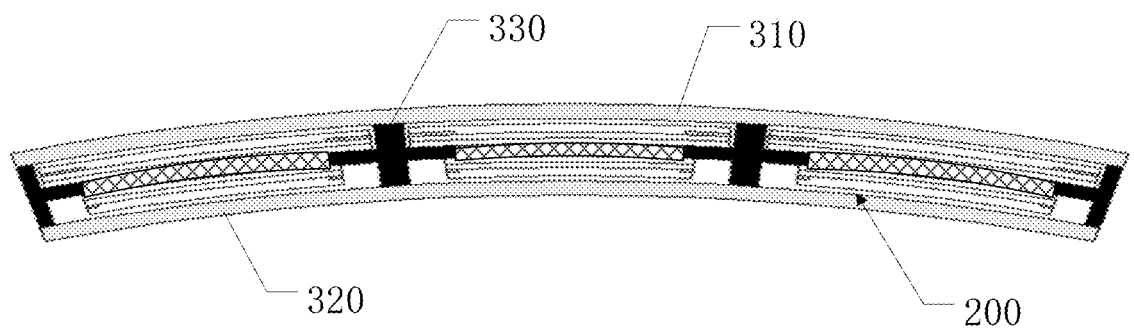
FIG. 12 is a schematic diagram illustrating another bend state of a display panel according to an embodiment of the present disclosure.

For example, FIG. 11 is a schematic diagram illustrating a bend state of a display panel according to an embodiment of the present disclosure. FIG. 12 is a schematic diagram illustrating another bend state of a display panel according to an embodiment of the present disclosure. As illustrated in FIG. 11, when the first electrode is shrunk by controlling the first driving electrode of each pixel unit 200 and the second electrode is expanded by controlling the second driving electrode, each pixel unit can be driven to bend to the side where the first electrode is located. As illustrated in FIG. 12, when the first electrode is expanded by controlling the first driving electrode of the pixel unit 200 and the second electrode is shrunk by controlling the second driving electrode, each pixel unit can be driven to bend to the side where the second electrode 220 is located. The display substrate achieves a whole curvature change by making each pixel unit 200 have a different curvature degree, and the user is provided with an optimal viewing experience.

For example, when the user is close to the display panel, the whole curvature of the display panel can be adjusted, so that the whole curvature of the display panel is large, so that the user has the best viewing experience; when the user is far away from the display panel, the whole curvature of the display panel can be adjusted, so that the whole curvature of the display panel is small, so that the user has the best viewing experience.

Figure 13:
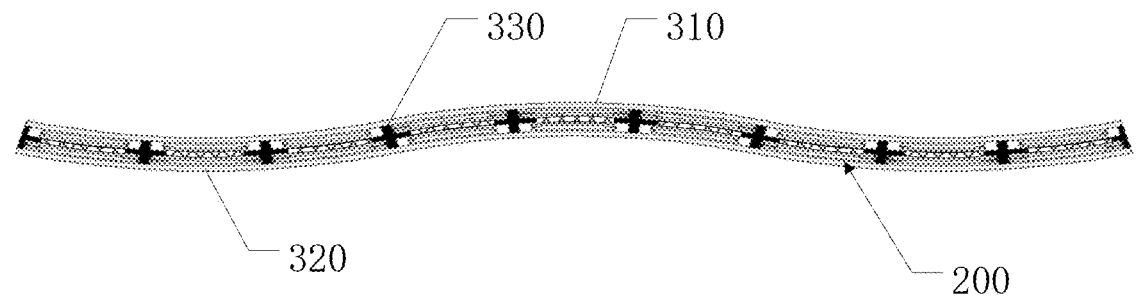
FIG. 13 is a schematic diagram illustrating a bend state of another display panel according to an embodiment of the present disclosure.

FIG. 13 is a schematic diagram illustrating a bend state of another display panel according to an embodiment of the present disclosure. FIG. 13 illustrates nine pixel units 200. As illustrated in FIG. 13, the first electrode and the second electrode of each pixel unit 200 can be individually controlled to be expanded or shrunk, so that the display panel can achieve a local curvature change, and more meticulous adjustment is performed to realize various display effects, such as a wave effect. Of course, the present disclosure includes but is not limited to the wave effect, the display panel can perform various local bends according to actual needs to provide more vision experience for the user.

At least one embodiment of the present disclosure further provides a display device, including the display panel according to any one of the above embodiments. Therefore, the display device has the technical effects corresponding to the technical effects of the display panel included in the display device. For details, refer to the related description, and details are not described herein again.

For example, the display device can be an electric device with a display function such as a television, a computer, a mobile phone, a navigator, etc.

Figure 14:
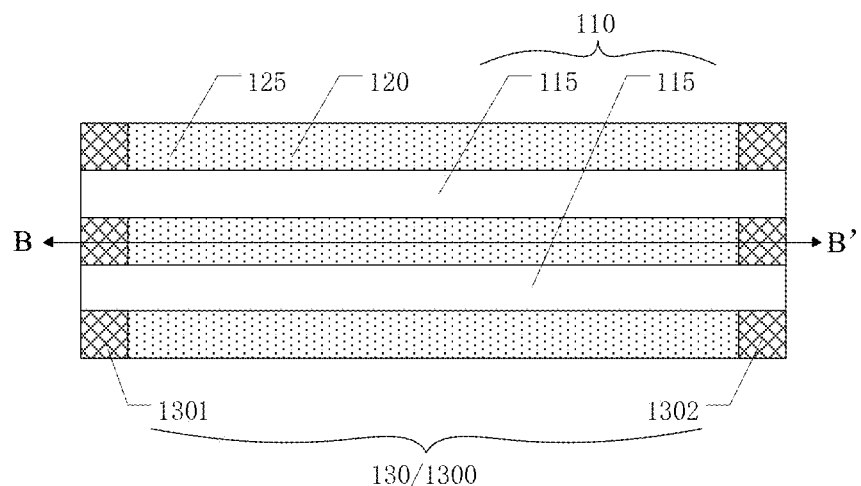
FIG. 14 is a schematic plan view of an electrode structure according to an embodiment of the present disclosure.

At least one embodiment of the present disclosure further provides an electrode structure. FIG. 14 is a schematic plan view of an electrode structure according to an embodiment of the present disclosure. As illustrated in FIG. 14, the electrode structure includes an electrode body 110, an electrostriction layer 120 connected to the electrode body 110 and a driving electrode 130 connected to the electrostriction layer 120. Since the electrostriction layer 120 is made of an electrostriction material, the electrostriction layer 120 can expand or shrink under an electric signal of the driving electrode 130 and drive the electrode body 110 to expand or shrink. It should be noted that, the first electrode 210 can adopt this electrode structure.

In the electrode structure provided by the embodiment, the electrode body can be expanded or shrunk by controlling the driving electrode to apply an electric signal to the electrostriction layer, and the curvature of the display substrate adopting the electrode structure is changed in whole or in part to realize the curved surface display, and the bending curvature of the display substrate can be controlled. Therefore, the bending curvature of the display substrate adopting the electrode structure can be adjusted according to the viewing position of the user and other needs, and the display effect is optimized. In addition, in the display substrate adopting the electrode structure, since the electrode of each sub pixel can be individually controlled to bend, a local curvature of the display substrate can be adjusted more meticulously to realize various display effects, such as a wave effect. Moreover, the display substrate adopting the electrode structure does not need to additionally increase a bending curvature adjustment structure, and has the advantages such as being light and thin, having low process difficulty, etc.

For example, in some examples, as illustrated in FIG. 14, the electrostriction layer 120 can expand or shrink in the first direction under the electric signal of the driving electrode 130, the driving electrode 130 includes at least one pair of sub driving electrodes 1300, which includes a sub driving electrode 1301 and a sub driving electrode 1302 respectively disposed on two opposite ends of the electrostriction layer 120 in the first direction. Therefore, the electrostriction layer 120 can be driven to expand or shrink in the first direction by applying voltage or current to the sub driving electrodes 1301 and 1302. Moreover, the amount of extension or shrink of the electrostriction layer can be controlled by controlling the magnitude of the voltage or current applied to the sub driving electrodes 1301 and 1302.

For example, in some examples, as illustrated in FIG. 14, the electrostriction layer 120 includes a plurality of electrostriction strips 125; the plurality of electrostriction strips 125 can be spaced apart on the electrode body 110; the driving electrode 130 includes a plurality of pairs of sub driving electrodes 1300 connected to the plurality of sub electrostriction strips 125. It should be noted that, the plurality of pairs of sub driving electrodes 1300 of the driving electrode 130 can be applied with the same electric signal or can also be applied with different electric signals.

In some examples, the sub electrostriction strips extend in the first direction, and the plurality of sub electrostriction strips are spaced apart from one another in a direction perpendicular to the first direction.

Figure 15:
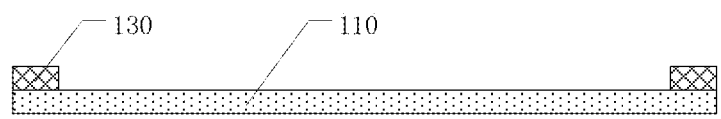
FIG. 15 is a schematic section view of an electrode structure taken along line B-B' of FIG. 14 according to an embodiment of the present disclosure.

FIG. 15 is a schematic sectional view of an electrode structure taken along line B-B' of FIG. 14 according to an embodiment of the present disclosure. As illustrated in FIG. 15, the electrode body 110 includes a plurality of sub electrode strips 115, the electrostriction layer 120 includes a plurality of sub electrostriction strips 125, the plurality of sub electrode strips 115 and the plurality of sub electrostriction strips 125 are disposed alternately. That is to say, the plurality of sub electrode strips 115 and the plurality of sub electrostriction strips 125 are disposed on the same layer.

For example, in some examples, the adjacent side surfaces of the alternately disposed sub electrode strips and sub electrostriction strips are connected, so that the electrode body and the electrostriction layer are connected, and when the electrostriction layer is expanded or shrunk, it is convenient to drive the electrode body to be expanded or shrunk.

For example, in some examples, the electrode body includes a flexible electrode material. That is to say, the electrode body is a flexible electrode, thereby it can be easily expanded or shrunk when the electrostriction layer is expanded or shrunk.

For example, the electrode body can include a carbon-based flexible material, such as graphene. Of course, the embodiment of the present disclosure includes but is not limited to this, the electrode body can also be other flexible materials.

For example, the electrode body includes a transparent electrode material, such as an indium tin oxide (ITO) material.

For example, in some examples, the electrostriction layer includes a transparent electrostriction material, that is to say, the electrostriction layer can be transparent, thereby avoiding affecting the aperture ratio or light transmission ratio of the display substrate adopting the electrode structure.

For example, the electrostriction material can include a lead lanthanum zirconate titanate (PLZT) material to achieve transparency.

For example, in some examples, the driving electrode is insulated from the electrode body, so that the mutual interference between the electric signal of the driving electrode and the electric signal of the electrode body is prevented.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A display substrate, comprising: a plurality of pixel units arranged in an array, wherein at least one of the pixel units comprises:
   a first electrode, comprising a first electrode body, a first electrostriction layer connected to the first electrode body and a first driving electrode electrically connected to the first electrostriction layer,
   wherein the first electrostriction layer is configured to expand or shrink according to an electric signal of the first driving electrode and drive the first electrode body to expand or shrink,
   wherein the first driving electrode comprises at least one first sub driving electrode pair, two first sub driving electrodes of each first sub driving electrode pair are respectively on two opposite ends of the first electrostriction layer in a first direction, and the first electrostriction layer is configured to expand or shrink in the first direction according to the electric signal of the first driving electrode.

2. The display substrate according to claim 1, wherein the first electrostriction layer comprises:
   a plurality of first sub electrostriction strips, spaced apart from one another on a surface at a side of the first electrode body.

3. The display substrate according to claim 1, wherein the first electrode body comprises a plurality of first sub electrode strips, the first electrostriction layer comprises a plurality of first sub electrostriction strips, and the plurality of first sub electrode strips and the plurality of first sub electrostriction strips are disposed alternately and on a same layer.

4. The display substrate according to claim 1, wherein the first electrode body comprises a flexible electrode material.

5. The display substrate according to claim 1, wherein the first electrode body comprises a transparent electrode material, and the first electrostriction layer comprises a transparent electrostriction material.

6. The display substrate according to claim 5, wherein the transparent electrostriction material comprises a lead lanthanum zirconate titanate material.

7. The display substrate according to claim 1, wherein the first driving electrode and the first electrode body are insulated from each other, and the first electrostriction layer and the first electrode body are insulated from each other.

8. The display substrate according to claim 1, wherein the at least one of the pixel units further comprises:
   a second electrode; and
   a light-emitting layer between the first electrode and the second electrode,
   wherein the second electrode comprises a second electrode body, a second electrostriction layer connected to the second electrode body and a second driving electrode electrically connected to the second electrostriction layer, and the second electrostriction layer is configured to expand or shrink according to an electric signal of the second driving electrode and drive the second electrode body to expand or shrink.

9. The display substrate according to claim 8, wherein the second driving electrode comprises at least one second sub driving electrode pair, two second sub driving electrodes of each second sub driving electrode pair are respectively on two opposite ends of the second electrostriction layer in a second direction, and the second electrostriction layer is configured to expand or shrink in the second direction according to the electric signal of the second driving electrode.

10. The display substrate according to claim 9, wherein the first direction and the second direction are identical to each other.

11. The display substrate according to claim 8, wherein the second electrode body comprises a plurality of second sub electrode strips, the second electrostriction layer comprises a plurality of second sub electrostriction strips, and the plurality of second sub electrode strips and the plurality of second sub electrostriction strips are disposed alternately and on a same layer.

12. The display substrate according to claim 8, wherein the at least one of the pixel units further comprises:
   a hole injection layer on a side of the first electrode close to the light-emitting layer;
   a hole transport layer on a side of the hole injection layer close to the light-emitting layer;
   an electron injection layer on a side of the second electrode close to the light-emitting layer; and
   an electron transport layer on a side of the electron injection layer close to the light-emitting layer.

13. The display substrate according to claim 8, wherein the second electrode body comprises a flexible electrode material.

14. The display substrate according to claim 8, wherein the second electrode body comprises a transparent electrode material, and the second electrostriction layer comprises a transparent electrostriction material.

15. A display panel, comprising the display substrate according to claim 1, and further comprising:
- a first base substrate;
- a second base substrate opposite to the first base substrate; and
- a supporting structure between the first base substrate and the second base substrate,
- wherein the plurality of pixel units are between the first base substrate and the second base substrate, the supporting structure is around the pixel units, the supporting structure is connected to the light-emitting layer of the at least one of the pixel units to support the at least one of the pixel units, and the pixel units are respectively spaced apart from the first base substrate and the second base substrate.

16. The display panel according to claim 15, wherein the supporting structure comprises a pixel defining structure.

17. A display device, comprising the display panel according to claim 15.

* * * * *